United States Patent [19]

Tolman

[11] Patent Number: 4,458,113
[45] Date of Patent: Jul. 3, 1984

[54] CONDUCTOR PAIR IDENTIFIER APPARATUS

[75] Inventor: Jay A. Tolman, Leander, Tex.

[73] Assignee: A.P.C. Industries, Inc., Austin, Tex.

[21] Appl. No.: 364,308

[22] Filed: Apr. 1, 1982

[51] Int. Cl.³ .............................................. H04B 3/46
[52] U.S. Cl. ............................... 179/175.3 A; 324/66; 333/14
[58] Field of Search ................... 179/175.3 A, 175.25, 179/175.1 R; 324/66, 67; 371/22; 333/14

[56] References Cited

U.S. PATENT DOCUMENTS 3,882,287 5/1975 Simmonds .................... 179/175.3 A
4,377,788 3/1983 Christopher et al. ............ 333/14 X
4,381,488 4/1983 Fricke et al. ............................ 333/14

Primary Examiner—Stafford D. Schreyer
Attorney, Agent, or Firm—Donald M. Sell; James A. Smith; Robert L. Marben

[57] ABSTRACT

Improved telephone cable conductor pair identifier apparatus incorporates an "Expander" which is interposed at an appropriate location in the amplifier and filtering circuitry between the pick up probe and the audio signal emitter, or speaker. The "Expander" acts to accentuate the differences in the amplitudes of signals present, thereby significantly enhancing the effective sensitivity of a human operator to signal amplitude differences, with a resulting remarkable improvement in the ability of the human operator to readily and accurately locate and select a telephone cable conductor being sought. Switch means may be provided to permit the "Expander" to be bypassed at the will of the human operator, since it may be desirable to use the "Expander" only in the more difficult cases of conductor pair identification.

2 Claims, 3 Drawing Figures

CONDUCTOR PAIR IDENTIFIER APPARATUS

FIELD OF INVENTION

The invention relates to improved apparatus for identifying conductor pairs in a telephone cable.

DESCRIPTION OF THE PRIOR ART

It is conventional practice to use pair identifier apparatus to identify conductor pairs in a telephone cable. Such apparatus typically includes a signal sensor or pickup device which may involve an active or a passive probe, suitable amplifiers and filters, and an audio signal emitter such as a speaker. The probe, when located adjacent a conductor, will pick up a signal that is present on the conductor. When probing among the conductors of a cable, the loudest tone will be heard when the probe is adjacent the conductor sought, to which a actual signal has been applied. Unfortunately, due to various phenomena such as a large amount of spreading or "cross-talk" (especially with non-working cables), it is difficult to tell which conductor has the most signal, since some of the other cable conductor pairs may have a signal that is not much smaller than the signal that was applied to the conductor being sought. The problem is exacerbated by the insensitivity of the human ear to amplitude differences. The sensitivity of the human ear to amplitude differences depends on a number of factors, such as the amplitude and frequency of the signal and the specific hearing characteristics of a particular listener. As an example, taken from page 37-25, FIG. 23, of Reference Data For Radio Engineers, published by Howard W. Sams Co., Inc., sixth edition, first printing, 1975; at a frequency of 600 Hertz and 10 decibels above threshold, the sensitivity might typically be about 3.0 decibels. In other words, the difference between the signal amplitude from the conductor being sought and the signal amplitude from other conductors would have to be at least 3.0 decibels in order for the human operator to be able to accurately locate or select the conductor being sought.

The objective of the present invention is to provide improved pair identifier apparatus which will permit a human operator to more readily and accurately locate and select a telephone cable conductor being sought.

SUMMARY OF THE INVENTION

A device known as a "Compander" has been conventially utilized to improve signal-to-noise ratio in some applications, e.g. the Dolby noise reduction system, telephone signal transmission systems, etc. The present invention stems from the realization that the "Expander" portion of a "Compander" could be utilized to accentuate the differences in the amplitudes of two signals. Then, if an "Expander" were incorporated in a conductor pair identifier apparatus, the effective sensitivity of a human operator to signal amplitude differences could be significantly enhanced, thereby permitting the human operator to more readily and accurately locate and select a telephone cable conductor being sought.

Thus, the present invention involves the incorporation of an "Expander" in a conductor pair identifier apparatus. It has been found in actual practice that an expansion factor of 4 to 1 is a good choice, so that if 3.0 decibels is assumed to be a minimum detectable difference, then the effective sensitivity for a human operator is increased to 3.0/4 or 0.75 decibels. Such an increase in the effective sensitivity amounts to a significant improvement in the pair identifier apparatus, since the ability of the human operator to readily and accurately locate and select a telephone cable conductor being sought is remarkably enhanced.

When the "Expander" is used, there is a tendency for the true amplitude relation of signals to be distorted. Consequently, it may be desirable to use the "Expander" only for the more difficult cases of conductor pair identification. Accordingly, switch means may be provided to permit the "Expander" to be bypassed at the will of the human operator.

DESCRIPTION OF PREFERRED EMBODIMENT

Figure 1:
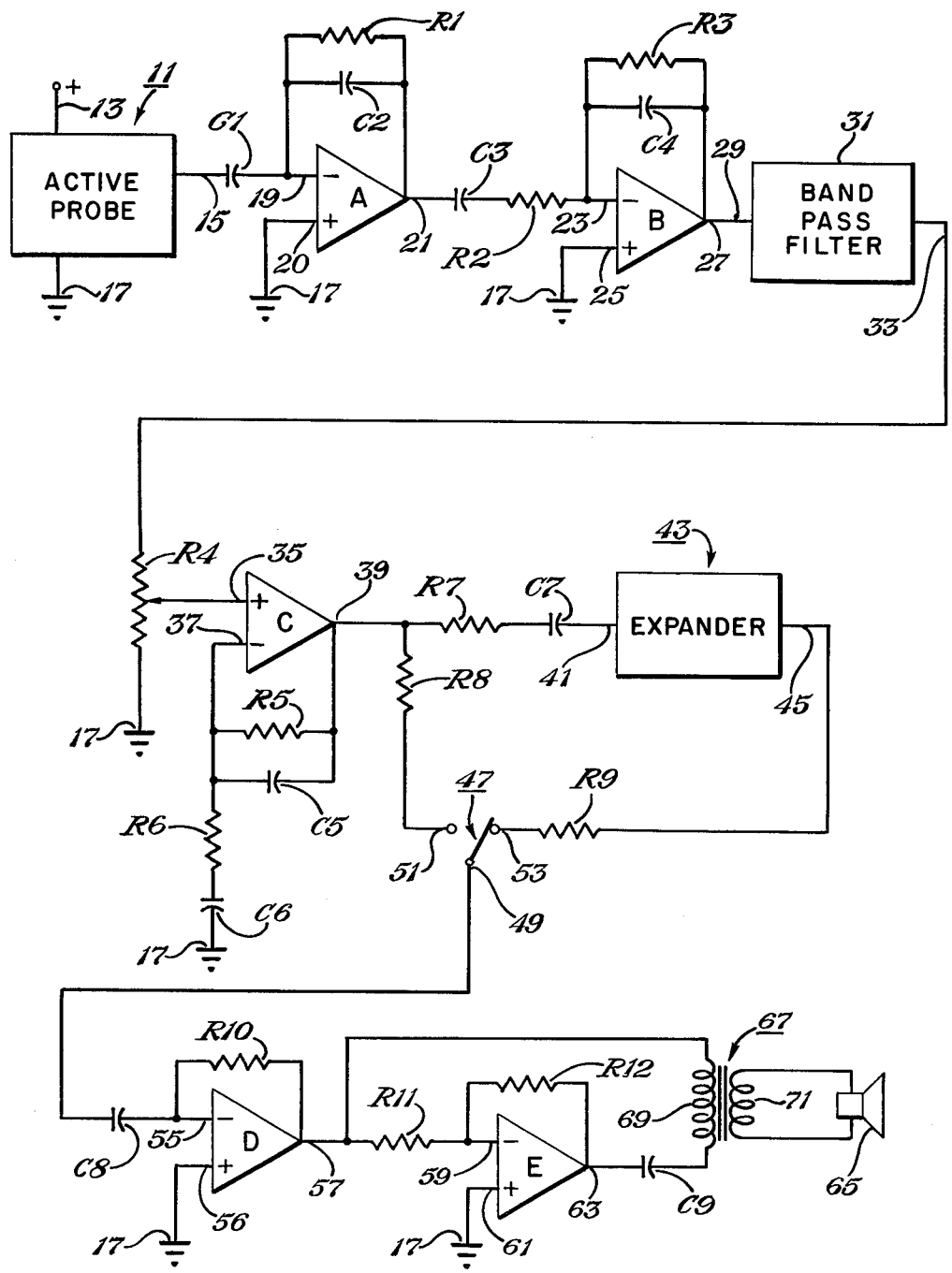
FIG. 1 is a schematic circuit diagram showing a conductor pair identifier apparatus in accordance with a preferred embodiment of the invention.

Referring now to the drawings, a typical conductor pair identifier apparatus in accordance with a preferred embodiment of the invention will be described. As shown in FIG. 1, an Active Probe, shown as a block 11, has a positive terminal 13, an output terminal 15, and a shield connected to ground 17. The output terminal 15 is connected in series with a capacitor $C_1$ to the input or negative terminal 19 of an operational amplifier A, which has a positive terminal 20 connected to ground 17, and an output terminal 21. A resistor $R_1$ and capacitor $C_2$ are connected in parallel with the input and output terminals 19, 21 of the operational amplifier A. The output terminal of the operational amplifier A is connected in series with a capacitor $C_3$ and resistor $R_2$ to the negative or input terminal 23 of an operational amplifier B, which has a positive terminal 25 connected to ground 17, and an output terminal 27. A resistor $R_3$ and capacitor $C_4$ are connected in parallel with the input and output terminals 23, 27 of operational amplifier B. The output terminal 27 of the operational amplifier B is connected to the input terminal 29 of a Band Pass Filter, shown as a block 31, and having an output terminal 33. The output terminal 33 of the Band Pass Filter is connected in series with a potentiometer $R_4$ to ground 17. The movable contact of the potentiometer $R_4$ is connected to the positive or input terminal 35 of an operational amplifier C, which has a negative terminal 37 and an output terminal 39. The negative terminal 37 of operational amplifier C is connected in series with a resistor $R_6$ and capacitor $C_6$ to ground 17. A resistor $R_5$ and capacitor $C_5$ are connected in parallel with the negative and output terminals 37, 39 of operational amplifier C. The output terminal 39 of operational amplifier C is connected in series with a resistor $R_7$ and capacitor $C_7$ to the input terminal 41 of an "Expander", shown as a block 43, which has an output terminal 45. There is provided a singe pole two position analog switch 47, which has a common contact 49, and "Expander" bypass contact 51 and an "Expander" mode contact 53. The output terminal 39 of operational amplifier C connected in series with a resistor $R_8$, the bypass and common contacts 51, 49 of the switch 47 and a capacitor $C_8$ to the negative or input terminal 55 of an operational amplifier D. The output terminal 45 of the "Expander" 43 is connected in series with a resistor $R_9$, the "Expander" mode and common contacts 53, 49 of the switch 47 and capacitor $C_8$ to the input terminal 55 of operational amplifier D. The operational amplifier D has a positive terminal 56, which is connected to ground 17, and an output terminal 57. A resistor $R_{10}$ is connected in parallel with the input and output terminals 55, 57 of operational amplifier D. The output terminal 57 of operational amplifier D is connected in series with a resistor $R_{11}$ to the negative or input terminal 59 of an operational amplifier E. The operational amplifier E has a positive terminal 61, which is connected to ground 17, and an output terminal 63. A resistor $R_{12}$ is connected in parallel with the input and output terminals 59, 63 of here operational amplifier E. There is provided a speaker 65, with a speaker transformer 67. The speaker transformer has a primary winding 69 and a secondary winding 71. The series combination of the primary winding 69 and a capacitor $C_9$ is connected at one end to the output terminal 57 of operational amplifier D and at the other end to the output terminal 63 of operational amplifier E. The speaker transformer secondary winding 71 is connected to the speaker 65.

Figure 2:
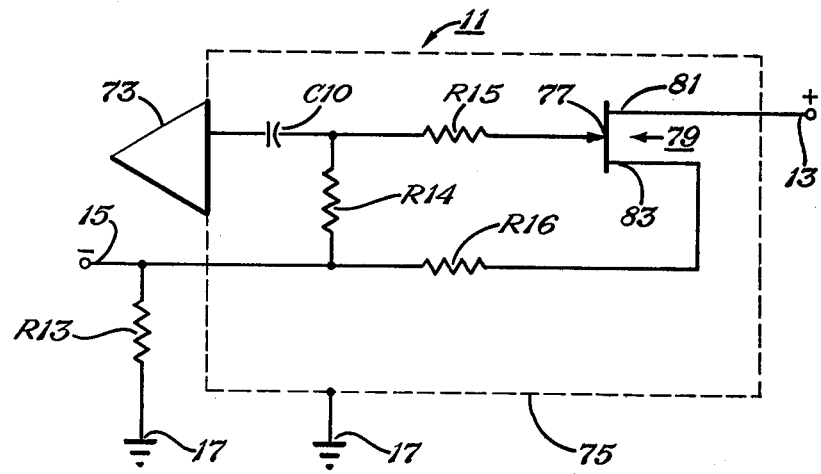
FIG. 2 is a schematic circuit diagram showing details of the Active Probe which is shown as a block in FIG. 1.

Details of the Active Probe 11 of FIG. 1 are shown schematically in FIG. 2. The Active Probe 11 has the conventional physical shape of a cylinder which is about 7 inches long and ½ inches in diameter and which has a conical metal tip 73 and a grounded metal sheath or shield 75. The metal tip 73 is connected in series with a capacitor $C_{10}$ and a resistor $R_{15}$ to the gate terminal 77 of a field effect transistor (FET) 79 which has a drain terminal 81 and a source terminal 83. The junction of capacitor $C_{10}$ and resistor $R_{15}$ is connected in series with a resistor $R_{14}$ to the negative terminal 15 of the Active Probe 11. The negative terminal 15 of the Active Probe 11 is connected in series with a resistor $R_{13}$ to ground 17. The source terminal 83 of the FET 79 is connected in series with a resistor $R_{16}$ to the negative terminal 15 of the Active Probe 11. The drain terminal 81 of the FET 79 is connected to the positive terminal 13 of the Active Probe 11.

Figure 3:
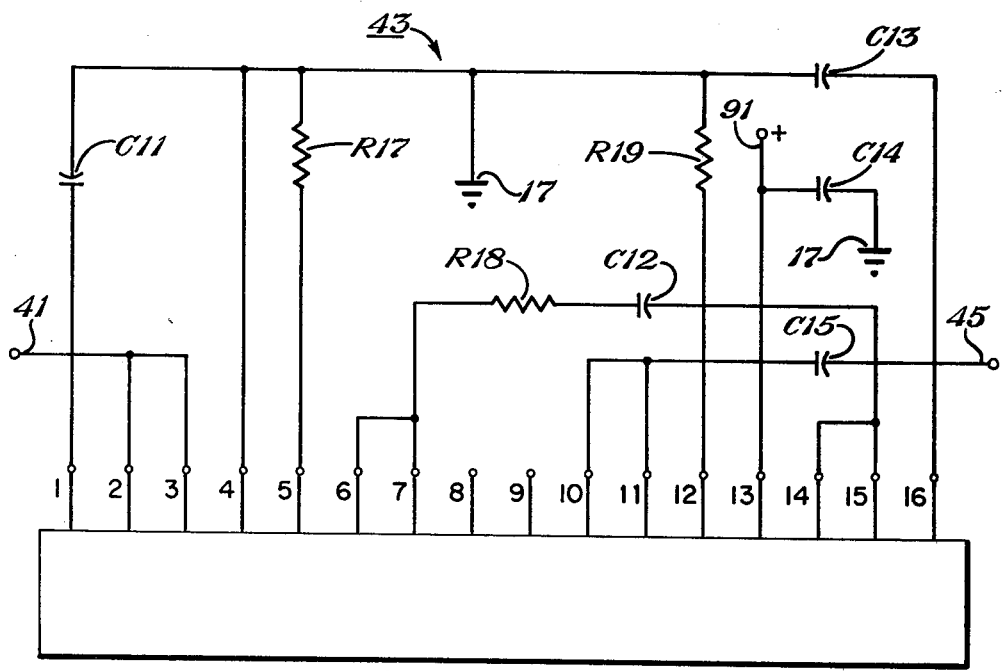
FIG. 3 is a schematic circuit diagram showing details of the "Expander", which is shown as a block in FIG. 1.

Details of the "Expander" 43 of FIG. 1 are shown schematically in FIG. 3. The "Expander" utilizes an integrated circuit "chip", shown as a block 89, and of a type that is designated by Signetics Corporation of Sunnyvale, Calif., as NE 570, which has pins or terminals including ones that are identified by the numbers 1 through 16. Pin 1 is connected in series with a capacitor $C_{11}$ to ground 17. The "Expander" input terminal 41 is connected to pins 2 and 3. Pin 4 is connected to ground 17 and pin 5 is connected in series with a resistor $R_{17}$ to ground 17. Pins 6 and 7 are connected together and in series with a resistor $R_{18}$ and a capacitor $R_{12}$ to pins 14 and 15. Pins 8 and 9 are open. Pins 10 and 11 are connected together and in series with a capacitor $C_{15}$ to the "Expander" output terminal 45. Pin 12 is connected in series with a resistor $R_{19}$ to ground 17. Pin 13 is connected to the positive terminal 91 of a voltage supply and also in series with a capacitor $C_{14}$ to ground 17. Pin 16 is connected in series with a capacitor $C_{13}$ to ground 17.

In operation, the signals picked up by the capacitive coupling effect of the metal tip 73 are passed via coupling capacitor $C_{10}$ and limiter resistor $R_{15}$ to the gate terminal 77 of the FET 79. Resistor $R_{14}$ and $R_{16}$ set the bias level for the FET 79. Resistor $R_{13}$ acts as a load resistor for the FET 79. The FET 79 serves as a voltage to current amplifier and also to lower the impedance at the Active Probe output 15.

The output of the Active Probe is fed via coupling capacitor $C_1$ to the input 19 of operational amplifier A. Resistor $R_1$ and capacitor $C_2$ set the gain of operational amplifier A, and capacitor $C_2$ provides a high frequency cutoff. Capacitor $C_1$ also acts in conjunction with resistor $R_{13}$ (FIG. 2) to effect a low frequency cut-off. The output of operational amplifier A is fed via coupling capacitor $C_3$ and resistor $R_2$ to the input 23 of operational amplifier B. Capacitor $C_3$ and resistor $R_2$, in conjunction with capacitor $C_4$ and resistor $R_3$, act to set the gain of operational amplifier B. Also, capacitor $C_3$ and resistor $R_2$ act to effect a low frequency cut-off, and capacitor $C_4$ and resistor $R_3$ act to effect a high frequency cut-off. Thus, operational amplifier stages A and B provide band pass filtering as well as amplification. The output of operational amplifier B is fed via Band Pass Filter 31 and potentiometer $R_4$ to the input 35 of operational amplifier C. Band Pass Filter 31 is set to pass 577.5 Hertz as a center frequency, with a "Q" of about 10 and a gain of about 1. Potentiometer $R_4$ is the manually operable volume control for the pair identifier apparatus. Resistor $R_5$ and capacitor $C_5$ in conjunction with resistor $R_6$ and capacitor $C_6$ act to set the gain of operational amplifier C, and also to provide further filtering. The output of operational amplifier C is fed via limiter resistor $R_7$ and coupling capacitor $C_7$ to "Expander" input 41. The "Expander" output 45 is fed via resistor $R_9$, switch 47 and coupling capacitor $C_8$ to the input of operational amplifier D. When the "Expander" is bypassed, the output of operational amplifier C is fed via resistor $R_8$, switch 47 and coupling capacitor $C_8$ to the input of operational amplifier D. Resistors $R_8$ and $R_9$, each in conjunction with resistor $R_{10}$, serve to set the gain for operational amplifier D. Resistors $R_{11}$ and $R_{12}$ act to set the gain for operational amplifier E. Operational amplifiers D and E provide a bridge drive for the speaker transformer 67. Capacitor $C_9$ blocks direct current flow to the transformer primary winding 69.

In the "Expander" 43 shown by FIG. 3, capacitors $C_{12}$ and $C_{15}$ act as coupling capacitors and capacitor $C_{14}$ acts as a de-coupling capacitor. Resistor $R_{18}$ acts as a current limiter, and resistors $R_{17}$ and $R_{19}$ act as bias resistors. Capacitors $C_{11}$ and $C_{13}$ act as filtering capacitors.

When the "Expander" is utilized, there is a tendency for the true amplitude relationship of the signals to be distorted. Consequently, it may be desirable to use the "Expander" only in the more difficult cases of pair identification. Accordingly, in the preferred embodiment, a switch means such as switch 47 is provided so that the "Expander" can be bypassed at the will of the operator. Another aspect of the "Expander" is that it lowers dynamic range, which requires a more careful setting of the volume control (potentiometer $R_4$ in the preferred embodiment).

The values of the resistors utilized in the preferred embodiment of the invention shown in FIGS. 1-3, given in Ohms, are: $R_1$—10K, $R_2$—39K, $R_3$—220K, $R_4$—25K, $R_5$—120K, $R_6$—10K, $R_7$—470, $R_8$—10K, $R_9$—10K, $R_{10}$—47K, $R_{11}$—20K, $R_{12}$—20K, $R_{13}$—220, $R_{14}$—10M, $R_{15}$—10M, $R_{16}$—1 (optional), $R_{17}$—10K, $R_{18}$—470, $R_{19}$—10K. The values of the capacitors, given in Farads are: $C_1$—1 $\mu$F, $C_2$—0.01 $\mu$F, $C_3$—0.01 $\mu$F, $C_4$—470 pF, $C_5$—680 pF, $C_6$—0.068 $\mu$F, $C_7$—1 $\mu$F, $C_8$—0.1 $\mu$F, $C_9$—0.44 $\mu$F, $C_{10}$—100 pF, $C_{11}$—1 $\mu$F, $C_{12}$—1 $\mu$F, $C_{13}$—1 $\mu$F, $C_{14}$—0.1 $\mu$F, $C_{15}$—1 $\mu$F. The FET 79 is a type 2N5484. The operational amplifiers A through E are all powered with +12 volt and −12 volt supplies. The voltage at the probe positive terminal 13 is in the range of about 6 to 13 volts, and the voltage at the probe negative terminal 15 is approximately 1 volt. The voltage at the positive terminal 91 which is connected to pin 13 of the integrated circuit chip 89 is 12 volts. The speaker transformer 67 is a Stancor type TA-42 and the input impedance of the speaker 65 is 8 Ohms.

The term "Expander" as used herein encompasses the "Expander" as shown by FIG. 3 and described in the preferred embodiment of the invention, as well as any other "Expander" that would serve to accomplish the same purpose; namely, to achieve significant accentuation of the differences in the amplitudes of two signals, so as to increase the effective sensitivity of a human operator to signal amplitude differences.

In the pair identifier apparatus as shown by FIGS. 1–3 and described in the preferred embodiment of the invention, an expansion factor of about 4 to 1 is chosen, so that if 3.0 decibels is assumed to be a minimum detectable difference, then the effective sensitivity for the human operator is increased to 3.0/4 or 0.75 decibels. Such an increase in the effective sensitivity amounts to a significant improvement in the pair identifier apparatus, since the ability of the human operator to readily and accurately locate and select a telephone cable conductor being sought is remarkably enhanced.

It is, of course, understood that numerous variations in the design details of pair identifier apparatus utilizing an "Expander" will occur to those skilled in the art.

I claim:

1. A telephone cable conductor pair identifier apparatus comprising a signal sensor device connected via a plurality of amplifier and filter stages to an audio signal emitter, with an "Expander" interposed in series with said amplifier stages.

2. The apparatus of claim 1 wherein there is additionally provided switch means operatively connected so as to effect bypass of the "Expander" at the will of a human operator.

* * * * *